(12) United States Patent
Komatsu et al.

(10) Patent No.: US 7,847,371 B2
(45) Date of Patent: Dec. 7, 2010

(54) ELECTRONIC COMPONENT

(75) Inventors: Takashi Komatsu, Tokyo (JP); Kouji Tanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 282 days.

(21) Appl. No.: 11/709,773

(22) Filed: Feb. 23, 2007

(65) Prior Publication Data

US 2007/0215379 A1   Sep. 20, 2007

(30) Foreign Application Priority Data

Feb. 28, 2006   (JP)   ............... P2006-053577

(51) Int. Cl.
- *H01L 21/02* (2006.01)
- *H01G 4/12* (2006.01)
- *H01G 4/30* (2006.01)

(52) U.S. Cl. .............. 257/532; 257/534; 174/258; 361/311; 361/312; 361/313; 361/320; 361/321.1; 361/321.2; 361/321.3; 361/321.4

(58) Field of Classification Search ........... 257/532; 174/258; 361/311–313, 320–321.4
See application file for complete search history.

(56) References Cited

U.S. PATENT DOCUMENTS

| | | | | |
|---|---|---|---|---|
| 3,679,950 A | * | 7/1972 | Rutt ................... | 361/321.4 |
| 4,803,543 A | * | 2/1989 | Inayoshi et al. ....... | 257/783 |
| 5,621,375 A | * | 4/1997 | Gurevich .............. | 337/297 |
| 6,232,144 B1 | * | 5/2001 | McLoughlin ........... | 438/104 |
| 6,381,117 B1 | * | 4/2002 | Nakagawa et al. ...... | 361/306.3 |
| 6,429,533 B1 | * | 8/2002 | Li et al. ............. | 257/783 |
| 6,531,806 B1 | * | 3/2003 | Daidai ................ | 310/344 |
| 6,621,011 B1 | | 9/2003 | Daidai et al. | |
| 6,911,893 B2 | * | 6/2005 | Kodama et al. ......... | 338/22 R |

(Continued)

FOREIGN PATENT DOCUMENTS

CN   1723514 A   1/2006

(Continued)

OTHER PUBLICATIONS

Office Action issued May 8, 2009 in Chinese Patent Application No. 2007100847817 (in Chinese).

(Continued)

*Primary Examiner*—Zandra Smith
*Assistant Examiner*—Jeremy J Joy
(74) *Attorney, Agent, or Firm*—Oliff & Berridge, PLC

(57) ABSTRACT

The present invention aims to provide an electronic component capable of reducing the occurrence of cracks at the joining portion with a board etc. A capacitor 1 (laminated ceramic capacitor) being one example of the electronic component of the present invention is provided with an element assembly 10 (ceramic) and a pair of external electrodes 20 formed on both side surfaces of the element assembly. In the element assembly 10, a dielectric layer 12 and an internal electrode 14 are laminated alternately. The external electrode 14 has such constitution that a first electrode layer connected with the internal electrode 14, a second electrode layer (electroconductive resin layer) including a hardened product of epoxy resin containing an epoxy compound having a molecular weight of 2000 or more and plural epoxy groups as the base compound, a third electrode layer composed of Ni and a fourth electrode layer composed of Sn are formed in this order from the element assembly side.

4 Claims, 1 Drawing Sheet

U.S. PATENT DOCUMENTS

| | | | |
|---|---|---|---|
| 2001/0035563 A1* | 11/2001 | Masumiya et al. | 257/532 |
| 2002/0041006 A1* | 4/2002 | Ahiko et al. | 257/532 |
| 2002/0130318 A1* | 9/2002 | Kodama et al. | 257/43 |
| 2003/0153650 A1* | 8/2003 | Tada et al. | 523/400 |
| 2005/0067703 A1* | 3/2005 | Hashimoto | 257/758 |
| 2006/0044098 A1* | 3/2006 | Kimura et al. | 336/122 |
| 2007/0201183 A1* | 8/2007 | Komatsu et al. | 361/311 |

FOREIGN PATENT DOCUMENTS

| | | |
|---|---|---|
| EP | 0 955 795 A2 | 11/1999 |
| EP | 1 335 392 A1 | 8/2003 |
| EP | 1 517 680 A1 | 9/2005 |
| JP | 05144665 A * | 6/1993 |
| JP | A-5-144665 | 6/1993 |
| JP | A-06-267784 | 9/1994 |
| JP | A-08-037127 | 2/1996 |
| JP | 08203771 A * | 8/1996 |
| JP | A-8-203771 | 8/1996 |
| JP | 11162771 A * | 6/1999 |
| JP | A-11-162771 | 6/1999 |
| JP | 11219849 A * | 8/1999 |
| JP | A 11-219849 | 8/1999 |
| JP | 2002033237 A * | 1/2002 |
| JP | 2002161123 A * | 6/2002 |
| JP | A-2002-161123 | 6/2002 |
| JP | A-2005-264095 | 9/2005 |
| KR | 2001-0062384 | 7/2001 |
| WO | WO 03/075295 | 9/2003 |

OTHER PUBLICATIONS

Office Action issued Jun. 2, 2009 in Japanese Patent Application No. 2006-053577 (in Japanese).

Aug. 11, 2010 European Office Action issued in European Patent Application No. 07 004 051.4.

* cited by examiner

ELECTRONIC COMPONENT

BACKGROUND OF THE INVENTION

1. Field of the Invention

The present invention relates to an electronic component, in particular to an electronic component using a ceramic material.

2. Related Background of the Invention

Many of electronic components such as a capacitor and inductor using a ceramic material have constitution that is provided with an element assembly composed of a ceramic material, an internal electrode provided inside the element assembly, and an external electrode provided on the surface of the element assembly so as to be connected with the internal electrode. For the electronic components, conventionally, methods have been studied for inhibiting cracks etc. of the element assembly that occur due to the difference between physical properties of the element assembly and the external electrode.

For example, JP-A-11-219849 describes that, in a laminated ceramic capacitor being an example of the electronic component having the aforementioned structure, an external electrode is given a three-layer structure provided with a first to third electroconductive layers from the element assembly side, wherein a layer including a resin component is provided as a second electroconductive layer and joining strength between respective layers is set in a predetermined range. In the laminated ceramic capacitor, due to the absorption of external force by the second electroconductive layer, etc., cracks in the element assembly tend to occur hardly.

SUMMARY OF THE INVENTION

Such electronic components as described above are used while being mounted on a board such as a printed-wiring board. In this case, generally, by soldering the external electrode to a terminal portion on the board, the electronic component is electrically connected with a circuit etc. provided on the board and, simultaneously, fixed on the board.

However, the result of the study by the present inventors revealed that, when thermal shock is added to a board on which the electronic component has been mounted etc., since the board and the electronic component have large difference in the degree of expansion and contraction by heat, stress concentrates at the soldered joining portion of them to lead to easy occurrence of cracks. Further, the occurrence of the crack at the joining portion could not sufficiently been inhibited often even when such laminated ceramic capacitor as described in the conventional document, in which the occurrence of the crack in an element assembly is reduced, was applied.

Accordingly, the present invention has been accomplished with the view of the circumstance, and aims to provide an electronic component capable of reducing the occurrence of cracks at a joining portion with a board etc.

In order to achieve the above purpose, the electronic component of the invention is provided with a ceramic element assembly, an internal electrode provided inside the ceramic element assembly, and an external electrode provided on the surface of the ceramic element assembly and electrically connected with the internal electrode, wherein the external electrode has an electroconductive resin layer including the hardened product of epoxy resin containing an epoxy compound having a molecular weight of 2000 or more and plural epoxy groups as a base compound.

The electroconductive resin layer included in the external electrode is one containing the epoxy resin hardened product including an epoxy compound having a molecular weight of 2000 or more as the base compound. Such epoxy resin hardened product has a reasonably small ratio of a cross-linked structure formed in the hardened structure, because the base compound being the raw material thereof has a long molecular chain. Consequently, the epoxy resin hardened product has such property as being flexible. Thus, the electroconductive resin layer including the epoxy resin hardened product also becomes flexible, as compared with a case where a layer includes an epoxy resin hardened product using an epoxy compound having a molecular weight of less than 2000 as the base compound. Accordingly, even when the electronic component of the invention is subjected to thermal shock in such state that it is mounted on the board by the soldering of the external electrode etc., the stress added to the joining portion caused by the difference in the volume alteration relative to the board is relaxed sufficiently by the flexible electroconductive resin layer in the external electrode. As the result, the electronic component of the invention hardly generates cracks at the joining portion with the board.

In the electronic component of the invention, more preferably the epoxy resin further includes phenol resin as a hardening agent. Hereby, the epoxy resin hardened product is led to have a good cross-linked structure in the structure thereof, and, as the result, the stress relaxation properties of the electroconductive resin layer becomes further excellent.

It is further preferred when the epoxy compound is a linear bifunctional epoxy compound having an epoxy group at both ends. This results in a further good reduction in the ratio of the cross-linked structure in the epoxy resin hardened product, and further improvement of the flexibility of the electroconductive resin layer including the epoxy resin hardened product, because the molecular chain itself of the base compound can be flexible.

DESCRIPTION OF THE PREFERRED EMBODIMENTS

Figure 1:
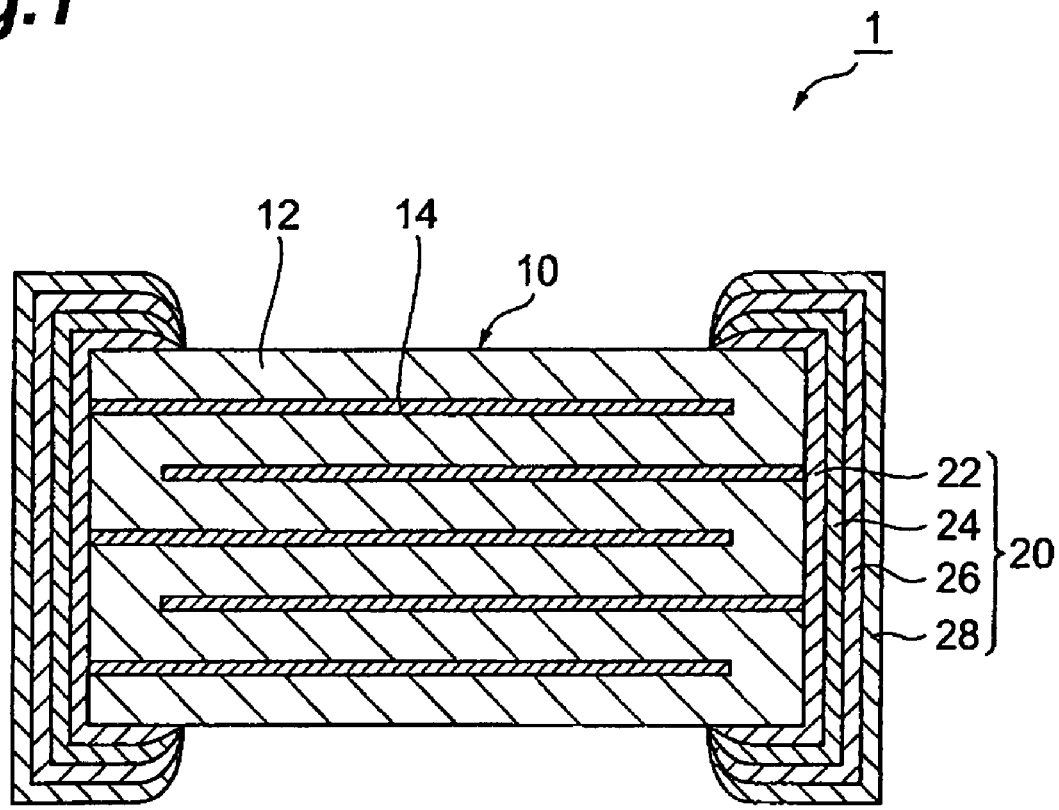
FIG. 1 is a drawing that schematically illustrates a cross-sectional constitution of the laminated ceramic capacitor according to a suitable embodiment.

Hereinafter, suitable embodiments of the present invention will be described while referring to the drawing. However, the present invention is not necessarily limited to the dimension ratio in the drawing. In the description below, a laminated ceramic capacitor is described as one example of the electronic component.

FIG. 1 is a drawing that schematically shows the cross-sectional constitution of the laminated ceramic capacitor (hereinafter, simply referred to as the "capacitor") according to a suitable embodiment. The shown capacitor 1 is constituted of an element assembly (ceramic element assembly) 10 and a pair of external electrodes 20 formed on both side surfaces of the element assembly 10.

In the element assembly 10, a dielectric layer 12 and an internal electrode 14 are alternately laminated so that the dielectric layer 12 is arranged on both outsides. Here, practically, respective adjacent dielectric layers 12 are unified in such degree that the boundary thereof can not be viewed. The internal electrode 14 is provided so that the only one end is exposed to the end face of the element assembly 10 on which an external electrode 20 is formed. The plural (here, five)

internal electrodes 14 arranged within the element assembly 10 are arranged so that the above-described end is alternately exposed to the facing end face of the element assembly 10 approximately parallel.

The dielectric layer 12 is constituted of a dielectric material including a ceramic material. As the ceramic material included in the dielectric material, in order to obtain excellent properties as a capacitor, a material having a high permittivity is preferred. For example, barium titanate ($BaTiO_3$)-based materials, Pb-containing complex perovskite compound-based materials, and strontium titanate ($SrTiO_3$)-based materials are suitable.

As the internal electrode 14, for example, one composed of Ni or Ni alloy can be mentioned. As the Ni alloy, one containing 95% by mass or more of Ni, and at least one of Mn, Cr, Co, Al etc. is preferred.

The external electrode 20 is parallel to the lamination direction of the dielectric layer 12 and internal electrode 14 in the element assembly 10, and is formed on each of two end faces facing to each other. The external electrode 20 has a 4-layer construction provided with a first electrode layer 22, a second electrode layer 24, a third electrode layer 26 and a fourth electrode layer 28, in this order from the element assembly 10 side.

The first electrode layer 22 is provided in close contact with the element assembly 10 and connected with the internal electrode 14 drawn to the end face of the element assembly 10. The first electrode layer 22 is composed of a metal material having a good electric connection with the internal electrode 14. As the metal material, Ag and Cu are preferred.

The second electrode layer 24 is an electroconductive resin layer including the epoxy resin hardened product and an electroconductive material. The second electrode layer 24 is mainly constituted of grains of an electroconductive material etc., and has a construction in which voids between the grains are filled with the epoxy resin hardened product. As the electroconductive material included in the second electrode layer 24, Ag is preferred.

For the second electrode layer 24, in the total mass of the electroconductive material and the epoxy resin hardened product, the electroconductive material is included in preferably 70-95% by mass, more preferably 80-90% by mass. The content of the electroconductive material of less than 70% may result in an insufficient conductivity of the second electrode layer 24. On the other hand, the content of more than 95% by mass tends to result in a relatively too small content of the epoxy resin hardened product, and insufficient flexibility of the second electrode layer 24.

The epoxy resin for forming the epoxy resin hardened product includes an epoxy compound having a molecular weight of 2000 or more and plural epoxy groups as the base compound. As the epoxy compound, a linear bifunctional epoxy compound having an epoxy group at the both ends thereof is preferred. As such epoxy compound, bisphenol type epoxy resin is preferred, wherein such compounds as represented by the general formula (1) below can be exemplified. Specifically, bisphenol-A type epoxy resin, bisphenol-F type epoxy resin, bisphenol-S type epoxy resin etc. are suitable:

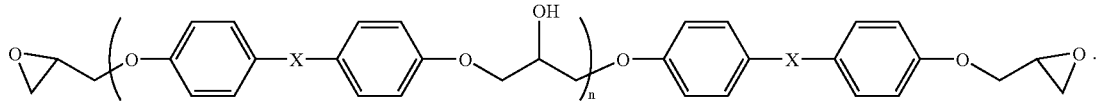

In the formula, X is a divalent group represented by the chemical formulae (2a)-(2e) below, and n is an integer of 4 or more:

$-C(CH_3)_2-$                            (2a)

$-CH_2-$                                 (2b)

$-CH(CH_3)-$                           (2c)

$-SO_2-$                                  (2d)

$-CPh_2-$                                 (2e)

The epoxy compound being the base compound has a molecular weight of 2000 or more, as described above. Here, the "molecular weight" means an average molecular weight. Specifically, the value of a number average molecular weight measured by gel permeation chromatography can be applied. An epoxy compound having a molecular weight of 2000 or more is, in other words, a compound having such molecular chain with length that gives a molecular weight of 2000 or more. Specifically, when the epoxy compound is a compound represented by the above-described general formula (1), n in the formula is preferably 5 or more, more preferably 6-20, further preferably 6-15.

The hardened product of epoxy resin including an epoxy compound having molecular weight of 2000 or more as the base compound becomes flexible, because the base compound has a long molecular chain to give a reasonably lessened cross-linked structure. Thus, the second electrode layer 24 including such hardened product also becomes flexible, therefore, when the external electrode 20 is fixed on the board, if stress occurs at the joining portion etc. due to the deformation of the board etc., the stress can be relaxed.

From the viewpoint of obtaining such effect more satisfactorily, the molecular weight of the epoxy compound being the base compound is preferably 3000 or more. But, when the epoxy compound has a molecular weight of more than 10000, since there may occur such disadvantage that the adhesiveness of the second electrode layer 24 with the first or third electrode layer 22, 26 degrades, the upper limit of the molecular weight of the epoxy compound is preferably set to around 10000.

The epoxy resin further includes suitably a hardening agent in addition to the above-described base compound. By being incorporated with a hardening agent, a cross-linked structure is formed satisfactorily in the epoxy resin. As the hardening agent, such publicly known epoxy resin hardening agent as phenol resin, amine or acid anhydride can be applied. Among these, as the hardening agent, phenol resin is preferred. The incorporation of the phenol resin as the hardening agent can result in a hardened product having reasonable flexibility and, in addition, being excellent in heat resistance. As the phenol resin, novolac type phenol resin and resole type phenol resin etc. can be mentioned, and, among these, novolac type phenol resin is preferred.

When the epoxy resin includes phenol resin as the hardening agent, the epoxy compound being the base compound and the phenol resin being the hardening agent are preferably blended so that epoxy compound/phenol resin gives 50/50-95/5 in mass ratio. In the total mass of the epoxy compound and the phenol resin, when the content of the epoxy compound is less than 50% by mass, the elasticity of the hardened product is heightened too much, thereby making it difficult to give the above-described second electrode layer 24 excellent in stress relaxation property. On the other hand, when the content exceeds 95% by mass, unreacted epoxy groups in the hardened product increase to absorb moisture easily, and thus sometimes the adhesiveness with the adjacent layer lowers. From the viewpoint of obtaining the second electrode layer 24 having good stress relaxation property and adhesiveness, the above-described epoxy compound content is preferably 50-95% by mass, more preferably 60-90% by mass.

The second electrode layer 24 includes the above-described hardened product of epoxy resin. The epoxy resin hardened product is mainly constituted of a chained polymerization structure constituted of the epoxy compound being the base compound or polymer thereof and a cross-linked structure formed by the above-described hardening agent so as to link two or more polymerization structures. The cross-linked structure is mainly formed by the reaction of an epoxy group in the polymerization structure with a functional group in the hardening agent capable of reacting with the epoxy group to generate a bond. As the functional group of the hardening agent, when the hardening agent is phenol resin, a hydroxyl group included in the resin can be mentioned.

The third electrode layer 26 is a metal layer formed so as to cover the surface of the second electrode layer 24. For example, a layer constituted of Ni can be mentioned. The fourth electrode layer 28 is a metal layer formed so as to cover further the surface of the third electrode layer 26. For example, a layer constituted of Sn can be mentioned. These third and fourth electrode layers 26, 28 serve to result in good electric connection between the external electrode 20 and a terminal etc. on the board. Further, they allow the external electrode 20 to be soldered to a terminal etc. on the board.

Next, a suitable method for manufacturing the capacitor 1 having the above-described constitution will be described.

Firstly, a raw material for dielectric material to constitute the dielectric layer 12 is prepared. For example, as the raw material for the ceramic material, oxides etc. of respective metal elements to constitute the ceramic material can be mentioned. After mixing the raw material, it is provisionally calcined at around 800-1300° C. The provisionally calcined product is pulverized until it has an intended grain diameter with a jet mill, ball mill etc. Then, to the pulverized product, a binder, plasticizer etc. are added to give a paste for forming the dielectric layer 12 (hereinafter, referred to as the "dielectric paste").

Further, powder of metal or alloy to constitute the internal electrode 14 are mixed with a binder, solvent etc. to prepare a paste for forming the internal electrode layer 14 (hereinafter, referred to as the "internal electrode paste").

Then, by coating alternately the dielectric paste and the internal electrode paste, a laminated body, in which the dielectric paste layer and the internal electrode paste layer are laminated alternately, is obtained. The laminated body is then cut into an intended size according to need, and subjected to treatment for removing the binder (debinder) in respective paste layers by heating etc. After that, the laminated body is normally calcined under an inert gas atmosphere such as $N_2$ or $H_2$ at 1200-1400° C. to give the element assembly 10. By such normal calcination, the dielectric paste layer and the internal electrode paste layer are converted into the dielectric layer 12 and the internal electrode 14, respectively.

After that, onto two end faces on which the end of the internal electrode 14 is exposed in the element assembly 10, such metal as Ag to constitute the first electrode layer 22 is baked to form the first electrode layer 22 on the surface of the end face. Specifically, for example, the first electrode layer 22 can be formed by coating an electroconductive paste prepared by adding a binder etc. to metal on the end face, and then calcining the same at a temperature of around 800° C.

Next, an electroconductive paste (electroconductive resin material) including an electroconductive material and thermohardening resin to form the above-described second electrode layer 24 is coated so as to cover the first electrode layer 22. After the coating, it is heated at around 150-250° C. to harden the thermohardening resin in the electroconductive paste, thereby forming the second electrode layer 24 on the surface of the first electrode layer 22.

Further, by such wet plating method as electrolytic plating, the third electrode layer 26 composed of Ni etc. is formed so as to cover the second electrode layer 24. Then, on the surface of the third electrode layer 26, the fourth electrode layer 28 composed of Sn etc. is formed in the same way. In this way, the capacitor 1 having the structure shown in FIG. 1 can be obtained.

The capacitor 1 having such constitution as described above is provided with the reasonably flexible second electrode layer 24 as described above in the external electrode. In the case where the capacitor 1 is fixed to the board etc. through the soldering etc. of the external electrode 20, since there is large difference, usually, in thermal volume change between the capacitor 1 and the board etc., when it is subjected to thermal shock, stress tends to concentrate on the portion where they are joined with soldering. In reality, in the capacitor 1, such stress can be sufficiently relaxed by the flexible second electrode layer 24 in the external electrode 20. Consequently, even when the above-described stress occurs by thermal shock etc., cracks hardly occur at the joining portion (soldered portion) of the capacitor 1 and the board.

The electronic component of the present invention is not limited to the laminated ceramic capacitor (capacitor 1) of the above-described embodiment. For example, firstly, the capacitor 1 is sufficient when it is provided with at least an electroconductive resin layer corresponding to the second electrode layer 24 as the external electrode 20. In other words, the external electrode 20 may be constituted of the second electrode layer 24 alone, or have a layered structure including more than four layers as described above. Further, when the external electrode 20 is constituted of plural layers, the forming position of the second electrode layer 24 (electroconductive resin layer) is not limited to the second layer from the element assembly 10 side. But, from the viewpoint of conducting satisfactorily the soldering etc. of the external electrode 20, the outermost layer of the external electrode 20 is preferably a metal layer of Sn etc., which is advantageous to the soldering, instead of the second electrode layer 24.

In addition, the electronic component of the present invention is not limited to the above-described laminated ceramic capacitor. It is not particularly limited when it is a ceramic electronic component having a structure provided with an external electrode on the surface of the ceramic element assembly. As the ceramic electronic component, a piezoelectric element, inductor, varistor, thermistor etc. can be mentioned.

EXAMPLES

The present invention will be described in further detail on the basis of Examples, but the present invention is not limited to these Examples.

[Manufacture of Capacitor]

Example 1

Firstly, an element assembly, in which a dielectric layer composed of barium titanate and an internal electrode layer composed of nickel were alternately arranged so that the dielectric layer lied on both outsides, was prepared. Next, on a pair of end faces facing to each other in the element assembly, an electroconductive paste containing Cu, glass frit and ethyl cellulose as an organic binder was coated, which was then calcined at 800° C. to form a first electrode layer on both end faces of the element assembly.

Next, on the surface of the first electrode layer, an electroconductive paste, which included 35% by weight of granular Ag powder having an average grain diameter of 1 μm, 35% by weight of flake-shaped Ag powder having an average grain diameter of 10 μm, 10% by weight of bisphenol-A type epoxy resin (base compound) having a molecular weight of 2900, 2% by weight of novolac type phenol resin hardening agent), and 18% by weight of butylcarbitol (solvent), was coated. Subsequently, the electroconductive paste was heated at 200° C. for 60 minutes to be hardened, thereby forming a second electrode layer on the first electrode layer.

After that, on the surface of the second electrode layer, a Ni-plated layer and a Sn-plated layer were formed sequentially by an electrolytic plating method to form a third electrode layer and a fourth electrode layer, respectively, to complete a capacitor provided with an external electrode of a four-layer structure on both end faces of the element assembly.

Example 2

A capacitor was obtained in the same way as in Example 1 except that, as the electroconductive paste for forming the second electrode layer, a paste including 33.7% by weight of granular Ag powder having an average grain diameter of 1 μm, 33.7% by weight of flake-shaped Ag powder having an average grain diameter of 10 μm, 9.6% by weight of bisphenol-A type epoxy resin (base compound) having a molecular weight of 3800, 1.9% by weight of novolac type phenol resin (hardening agent) and 21.1% by weight of butylcarbitol (solvent) was used.

Comparative Example 1

A capacitor was obtained in the same way as in Example 1 except that, as the electroconductive paste for forming the second electrode layer, a paste including 35% by weight of granular Ag powder having an average grain diameter of 1 μm, 35% by weight of flake-shaped Ag powder having an average grain diameter of 10 μm, 8% by weight of bisphenol-A type epoxy resin (base compound) having a molecular weight of 1650, 4% by weight of novolac type phenol resin (hardening agent) and 18% by weight of butylcarbitol (solvent) was used

[Thermal Shock Test]

Samples, in which respective capacitor elements in Examples 1-2 and Comparative Example 1 were fixed on a board by soldering the external electrode, were prepared. The samples were subjected to thermal shock test, in which thermal shock consisting of cooling at −55° C. for 30 minutes and heating at 125° C. for 30 minutes as one cycle was added in a predetermined number of cycles. After such test, whether or not cracks occurred at the soldered portion was checked. The thermal shock test was carried out under respective conditions including 1000, 2000 and 3000 cycles of the thermal shock. In the respective thermal shock tests, 50 samples corresponding to respective Examples and Comparative Example were used and, among 50 samples, the number of samples in which the occurrence of crack was observed was counted. It was defined as crack-occurring sample number. The obtained results are shown in Table 1.

TABLE 1

| | Crack-occurring sample number | | |
|---|---|---|---|
| | Thermal shock 1000 cycles | Thermal shock 2000 cycles | Thermal shock 3000 cycles |
| Example 1 | 0 | 0 | 0 |
| Example 2 | 0 | 0 | 0 |
| Comp. Ex. 1 | 0 | 2 | 5 |

From the Table 1, it was confirmed that capacitors in Examples 1 and 2 hardly generate cracks etc. at the soldered portion even when they are mounted on the board by soldering of the external electrode and subjected to thermal shock, as compared with the capacitor in Comparative Example 1.

As described above, in the electronic component according to the present invention, even when it is subjected to thermal shock in such state as has been joined to the board etc. by soldering of the external electrode, stress added to the joining portion to the board etc. can be relaxed to make it possible to reduce the occurrence of cracks at the joining portion.

What is claimed is:
1. An electronic component comprising:
a ceramic element assembly;
an internal electrode provided inside the ceramic element assembly; and
an external electrode provided on the surface of the ceramic element assembly and electrically connected with the internal electrode, wherein:
the external electrode has an electroconductive resin layer including:
an electroconductive material, and
a hardened product of epoxy resin containing an epoxy compound having a molecular weight ranging from 2000 to 10000 and plural epoxy groups as a base compound;
the electroconductive material is 70%-95% by mass of the total mass of the electroconductive material and the epoxy resin hardened product; and
the epoxy compound is a compound represented by the following general formula:

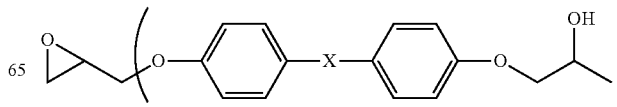

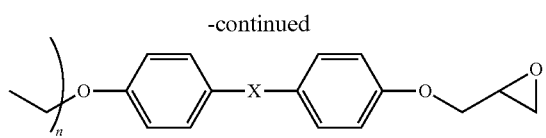

wherein x is a divalent group represented by the chemical formulae (2a)-(2e):

—C(CH₃)₂— (2a)

—CH₂— (2b)

—CH(CH₃)— (2c)

—SO₂— (2d)

—CPh₂- (2e), and n is an integer from 6 to 15.

2. The electronic component according to claim 1, wherein the epoxy resin further includes phenol resin as a hardening agent.

3. The electronic component according to claim 1, wherein the epoxy compound is a linear bifunctional epoxy compound having an epoxy group at the both ends thereof.

4. The electronic component according to claim 2, wherein a mass ratio of the epoxy compound/phenol resin is from 50/50 to 95/5.

* * * * *